United States Patent
Huang et al.

(10) Patent No.: US 9,343,417 B2
(45) Date of Patent: May 17, 2016

(54) HOLLOW METAL PILLAR PACKAGING SCHEME

(71) Applicant: Taiwan Semiconductor Manufacturing Company, Ltd., Hsin-Chu (TW)

(72) Inventors: Chang-Pin Huang, Yangmei Township (TW); Hsien-Ming Tu, Zhubei (TW); Hsien-Wei Chen, Hsinchu (TW); Tung-Liang Shao, Hsin-Chu (TW); Ching-Jung Yang, Pingzhen (TW); Yu-Chia Lai, Zhunan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 106 days.

(21) Appl. No.: 14/030,157

(22) Filed: Sep. 18, 2013

(65) Prior Publication Data

US 2015/0076689 A1    Mar. 19, 2015

(51) Int. Cl.
| | |
|---|---|
| *H01L 23/48* | (2006.01) |
| *H01L 23/52* | (2006.01) |
| *H01L 29/40* | (2006.01) |
| *H01L 23/00* | (2006.01) |
| *H01L 23/31* | (2006.01) |
| *H01L 21/56* | (2006.01) |
| *H01L 23/29* | (2006.01) |

(52) U.S. Cl.
CPC .............. *H01L 24/13* (2013.01); *H01L 21/566* (2013.01); *H01L 23/3192* (2013.01); *H01L 23/562* (2013.01); *H01L 24/11* (2013.01); *H01L 23/293* (2013.01); *H01L 24/81* (2013.01); *H01L 2224/03914* (2013.01); *H01L 2224/0401* (2013.01); *H01L 2224/05008* (2013.01); *H01L 2224/05548* (2013.01); *H01L 2224/05567* (2013.01); *H01L 2224/05647* (2013.01); *H01L 2224/1134* (2013.01); *H01L 2224/1147* (2013.01); *H01L 2224/1181* (2013.01); *H01L 2224/1191* (2013.01); *H01L 2224/11462* (2013.01); *H01L 2224/13005* (2013.01); *H01L 2224/13011* (2013.01); *H01L 2224/13012* (2013.01); *H01L 2224/13022* (2013.01); *H01L 2224/13024* (2013.01); *H01L 2224/13111* (2013.01); *H01L 2224/13124* (2013.01); *H01L 2224/13147* (2013.01); *H01L 2224/14131* (2013.01); *H01L 2224/16145* (2013.01); *H01L 2224/16225* (2013.01); *H01L 2224/16227* (2013.01); *H01L 2224/81193* (2013.01); *H01L 2224/81411* (2013.01); *H01L 2224/81815* (2013.01); *H01L 2924/181* (2013.01); *H01L 2924/351* (2013.01)

(58) Field of Classification Search
CPC .................. H01L 24/13; H01L 23/481; H01L 2224/05572; H01L 2224/16227; H01L 2924/15311
USPC .......... 257/692, 693, 697, 698, 773, 774, 778
See application file for complete search history.

(56) References Cited

U.S. PATENT DOCUMENTS

| | | | |
|---|---|---|---|
| 7,700,986 B2 * | 4/2010 | Huang | ................ H01L 21/4857 257/301 |
| 8,519,472 B2 * | 8/2013 | Jeong | ................ H01L 27/11582 257/324 |
| 2009/0072398 A1 * | 3/2009 | Irsigler | ............... H01L 23/5387 257/741 |

(Continued)

*Primary Examiner* — S. V. Clark
(74) *Attorney, Agent, or Firm* — Slater Matsil, LLP

(57) ABSTRACT

An integrated circuit includes a bottom substrate, a metal layer disposed over the bottom substrate and a hollow metal pillar disposed on the metal layer. The metal layer and the hollow metal pillar are electrically connected.

21 Claims, 5 Drawing Sheets

(56) References Cited

U.S. PATENT DOCUMENTS

2010/0013068 A1* 1/2010 Huang ............... H01L 21/4857
257/676

2013/0161787 A1* 6/2013 Kim .................... H01L 27/0207
257/532

2013/0241071 A1* 9/2013 Hsieh ...................... H01L 24/13
257/773

* cited by examiner

US 9,343,417 B2

HOLLOW METAL PILLAR PACKAGING SCHEME

TECHNICAL FIELD

The present disclosure relates generally to an integrated circuit and more particularly a hollow metal pillar packaging scheme.

BACKGROUND

For integrated circuit packaging, board level thermal cycling tests are used to test the wafer level package. One failure mechanism is solder ball cracks from thermal stress which may cause electrical connection failure. Such cracks result from the mismatch of coefficient of thermal expansion (CTE). A packaging scheme more resistant to thermal stress is desirable.

BRIEF DESCRIPTION OF THE DRAWINGS

Reference is now made to the following descriptions taken in conjunction with the accompanying drawings, in which:

FIG. 1A is a cross section view of an exemplary hollow metal pillar package according to some embodiments;

DETAILED DESCRIPTION

Figure 1B:
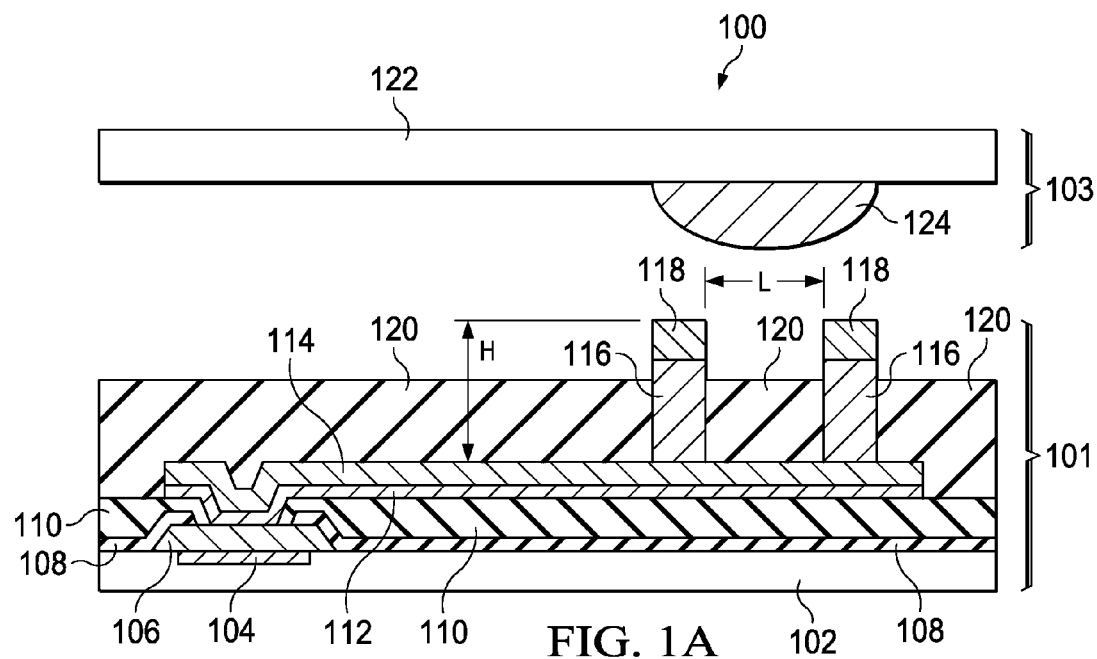
FIGS. 1B-1C are top views of exemplary hollow metal pillars according to some embodiments.
Figure 1B:
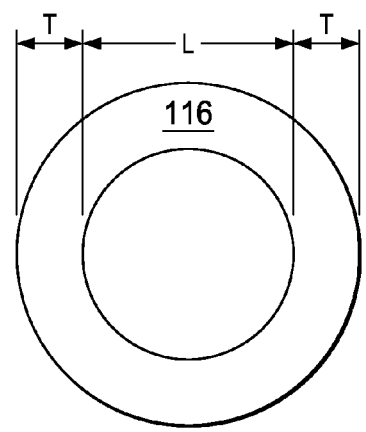

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1A is a cross section view of an exemplary hollow metal pillar package 100 according to some embodiments. The hollow metal pillar package 100 includes a bottom package 101 and a top package 103. The bottom package 101 includes a bottom substrate 102, a metal layer 104, a contact pad 106, passivation layers 108 and 110, a seed layer 112 and a metal layer 114 (e.g., a redistribution layer), a hollow metal pillar 116, solder layer 118, and a stress buffer layer 120. The top package 103 includes a top substrate 122 and a solder pad 124.

The bottom substrate 102 and the top substrate 122 comprise silicon, silicon dioxide, aluminum oxide, sapphire, germanium, gallium arsenide (GaAs), an alloy of silicon and germanium, indium phosphide (InP), silicon on insulator (SOI), or any other suitable material. The metal layer 104 is patterned for electrical wiring and comprises copper, aluminum, or any other suitable material. The contact pad 106 provides electrical connections and comprises copper, aluminum, or any other suitable material.

The passivation layers 108 and 110 provide insulation and protection for the surface below. In some embodiments, the passivation layer 108 comprises SiN/SiO and the passivation layer 110 comprises polymer material such as polybenzoxazole (PBO). The seed layer 112 facilitates the formation of the metal layer 114 (i.e., redistribution layer) above, and comprises copper with the metal layer 114 comprising copper in some embodiments.

The hollow metal pillar 116 provides electrical connection between the top package 103 and the bottom package 101. The hollow metal pillar 116 has a better thermal and electrical conductivity and reduced electromigration compared to a conventional solder ball.

The hollow metal pillar 116 comprises copper, aluminum, or any other suitable material. In some embodiments, the hollow metal pillar 116 has a height H of 80 µm-90 µm, an inner diameter L of 140 µm-160 µm, and a thickness T of about 40 µm-50 µm. In other embodiments, the size and dimension can be varied depending on applications.

The hollow metal pillar 116 provides proper standoff distance (height) between bottom substrate 102 and the top substrate 122, which also helps to have better temperature control. In one example, the hollow metal pillar 116 has a height of 90 µm due to a process specification. For example, some fabrication process using liquid molding compound (LMC) as the stress buffer layer 120 has a minimum thickness of 80 µm for the stress buffer layer 120, and the hollow metal pillar 116 should be higher than the stress buffer layer 120 for proper electrical connection.

The stress buffer layer 120 provides structural protection from stress and comprises liquid molding compound (LMC) in some embodiments. The stress buffer layer 120 increases the life time of the structure in the thermal cycle test by reducing the impact of coefficient of thermal expansion (CTE) mismatch of materials around the hollow metal pillar 116.

The hollow metal pillar 116 is higher than the stress buffer layer 120 by about 10 µm to ensure proper electrical contact with the solder pad 124 when the top package 103 is mounted on the bottom package 101 in some embodiments. The solder layer 118 and the solder pad 124 comprise SnAg or any other suitable material. The solder layer 118 has a height of about 10 µm-20 µm in some embodiments.

The hollow metal pillar package 100 saves cost and also provides better temperature cycle test results in life time cycle compared to other packaging schemes. The hollow metal pillar 116 has a better thermal and electrical conductivity and reduced electromigration compared to a conventional solder ball.

A person skilled in the art will understood that the top package 103 is simplified in FIG. 1A, and may have additional layers and features similar to the bottom package 101, such as metal layers, passivation layers, etc. Also, both the top package 103 and the bottom package 101 may include any other devices and components such as transistors, resistors, inductors, and capacitors among others.

Figure 1C:
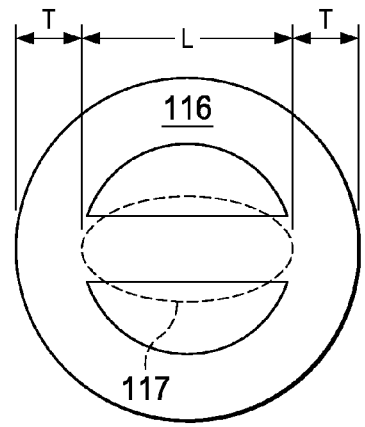

FIGS. 1B-1C are top views of exemplary hollow metal pillars 116 according to some embodiments. In FIG. 1B, the hollow metal pillar 116 has a cylindrical structure with a circular shape top view. In FIG. 1C, the hollow metal pillar 116 has a cylindrical structure with an inside divider 117 added to a circular shape in the top view. The inside divider 117 may increase the life time of the structure in the thermal cycle test for some embodiments.

The inside divider 117 provides better thermal conductivity (i.e., heat transfer) and may be aligned in the direction of coefficient of thermal expansion (CTE) mismatch. In other embodiments, the inside divider 117 may be arranged in a different shape, such as a cross shape with two lines crossing each other (i.e., "+" shape) instead of the one line shape (i.e., "–" shape).

In some embodiments, the hollow metal pillar 116 has a height H of about 80 μm-90 μm, an inner diameter L of 140 μm-160 μm, and a thickness T of about 40 μm-50 μm. In other embodiments, the size and dimension can be varied depending on applications.

Figure 2:
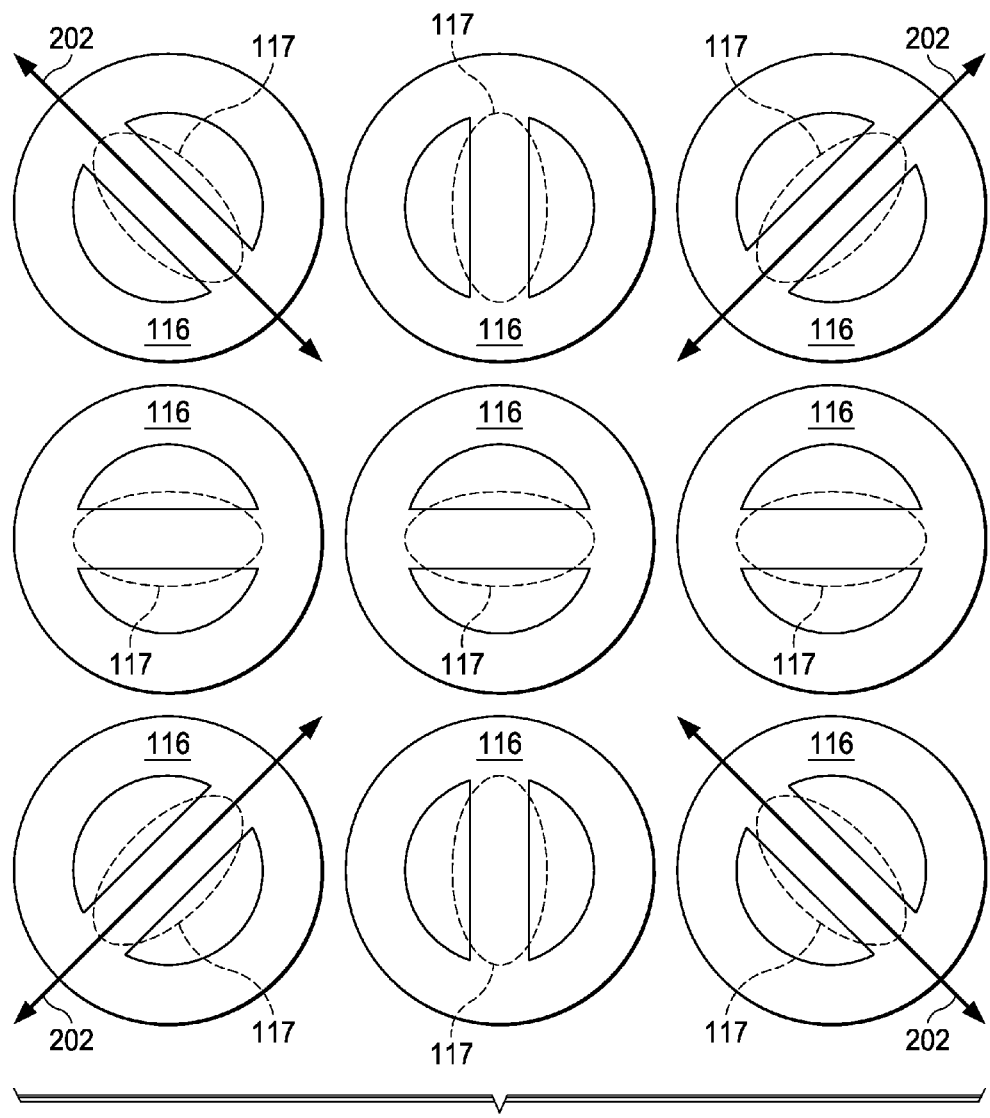
FIG. 2 is a top view of an exemplary arrangement of hollow metal pillars with inside dividers according to some embodiments.

FIG. 2 is a top view of an exemplary arrangement of hollow metal pillars 116 with inside dividers 117 according to some embodiments. The arrows 202 show the direction of CTE mismatch and the inside dividers 117 are aligned in the direction of the CTE mismatch. In other embodiments, the inside dividers 117 can be aligned to other directions depending on applications.

Figure 3A:
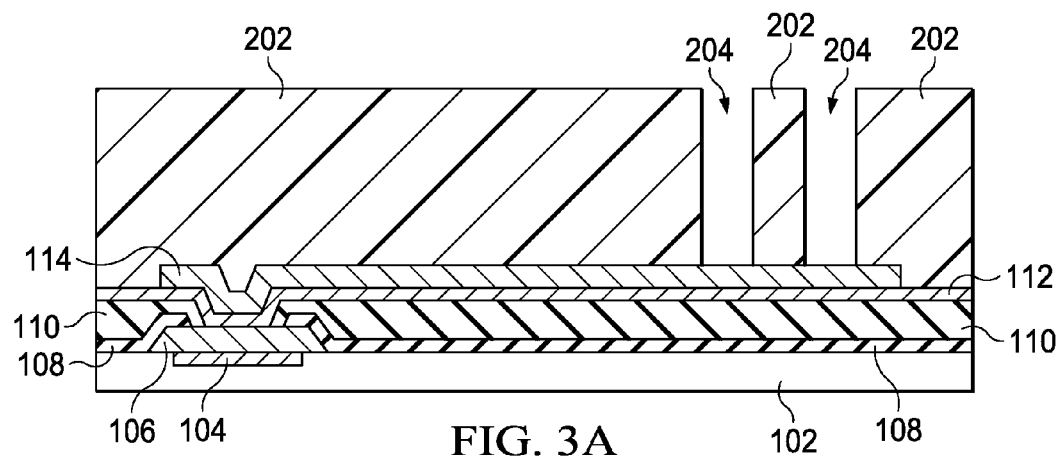
FIGS. 3A-3I are exemplary intermediate fabrication steps of the exemplary hollow metal pillar package in FIG. 1A according to some embodiments.

FIGS. 3A-3I are exemplary intermediate fabrication steps of the exemplary hollow metal pillar package in FIG. 1A according to some embodiments. In FIG. 3A, a photoresist 202 is deposited over the bottom substrate 102 and openings 204 for the hollow metal pillar 116 are formed by a photolithography process. The metal layer 104, the contact pad 106, passivation layers 108 and 110, the seed layer 112 and the metal layer 114 (e.g., a redistribution layer) can be formed by any known method in the art.

Figure 3B:
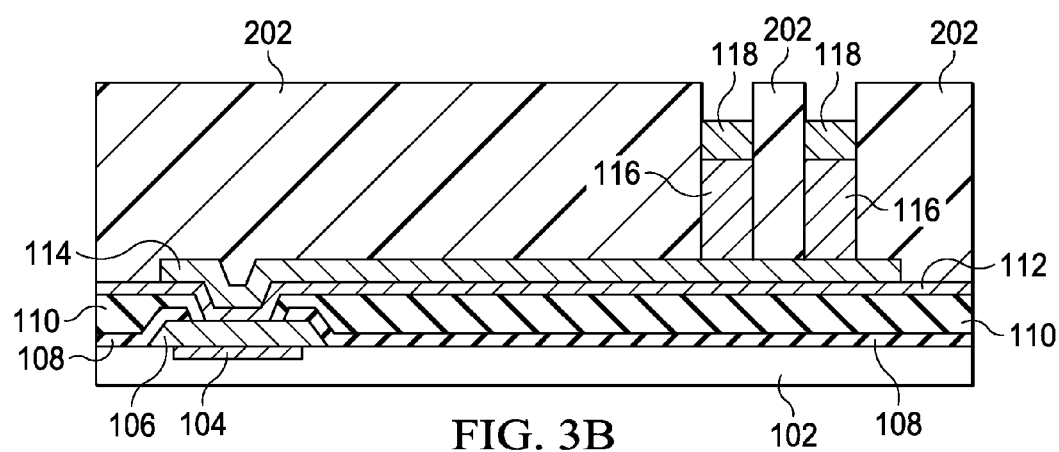

In FIG. 3B, the hollow metal pillar 116 and the solder layer 118 are deposited in the openings 204 by electroplating process, for example. In some embodiments, plasma cleaning such as O₂ plasma process can be performed prior to the deposition. The hollow metal pillar 116 comprises copper, aluminum, or any other suitable material. In some embodiments, the hollow metal pillar 116 has a height H of about 80 μm-90 μm, an inner diameter L of 140 μm-160 μm, and a thickness T of about 40 μm-50 μm. In other embodiments, the size and dimension can be varied depending on applications.

The hollow metal pillar 116 provides electrical connection between the top package 103 and the bottom package 101 in FIG. 1A. The hollow metal pillar 116 has a better thermal and electrical conductivity and reduced electromigration compared to a conventional solder ball. The solder layer 118 comprises SnAg or any other suitable material. The solder layer 118 has a height of about 10 μm-20 μm in some embodiments.

Figure 3C:
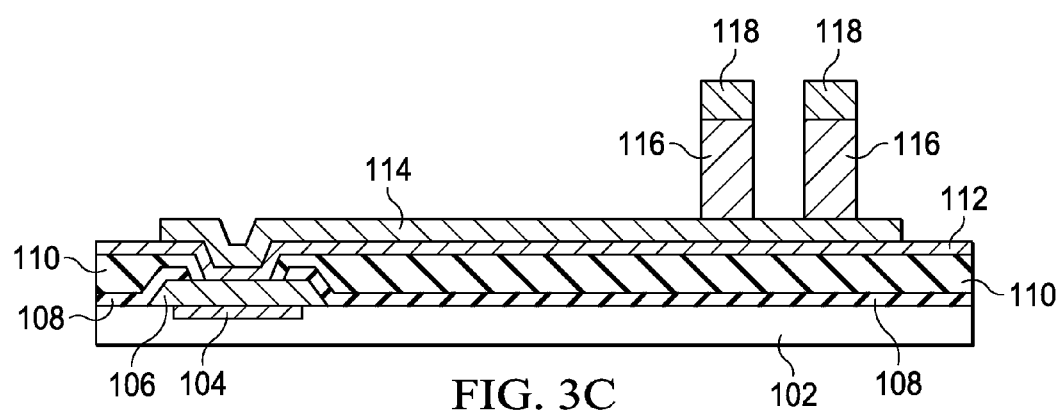

In FIG. 3C, the photoresist 202 is removed by a wet etching process, for example.

Figure 3D:
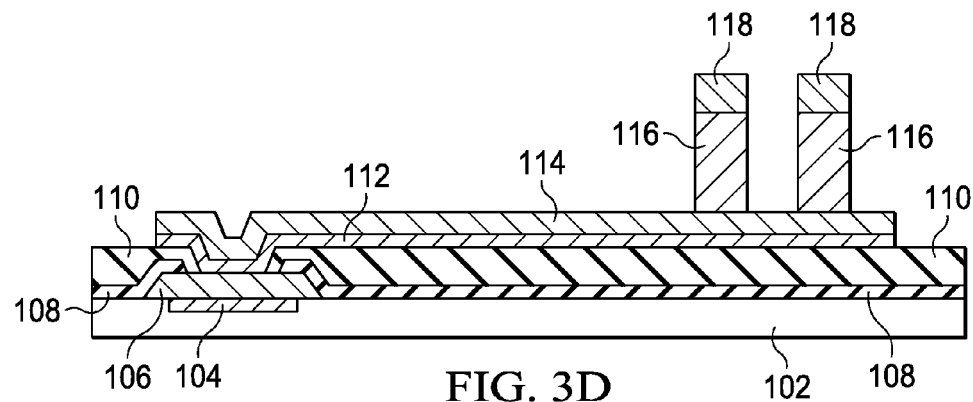

In FIG. 3D, the seed layer 112 outside of the metal layer 114 is removed by an etching process, for example.

Figure 3E:
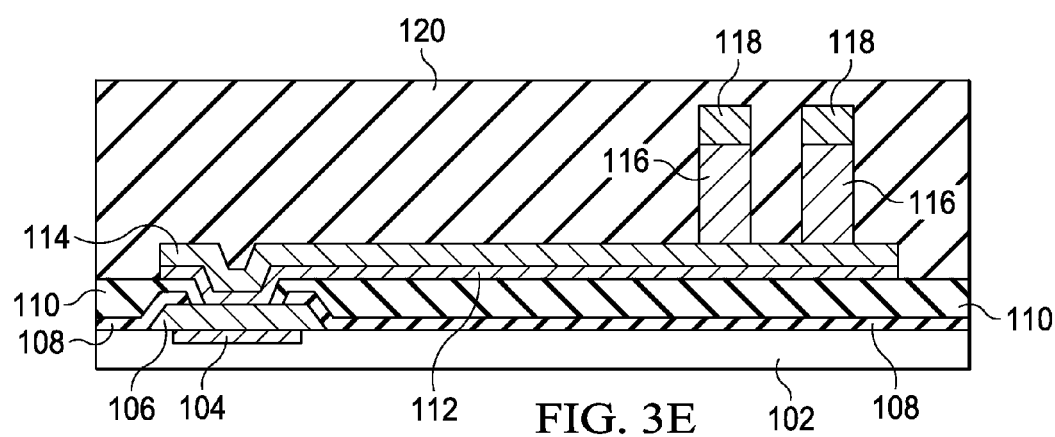

In FIG. 3E, the stress buffer layer 120 (e.g., liquid molding compound) is formed over the metal layer 114, the hollow metal pillar 116 and the solder layer 118 by coating, for example. The stress buffer layer 120 comprises polymer in some embodiments.

Figure 3F:
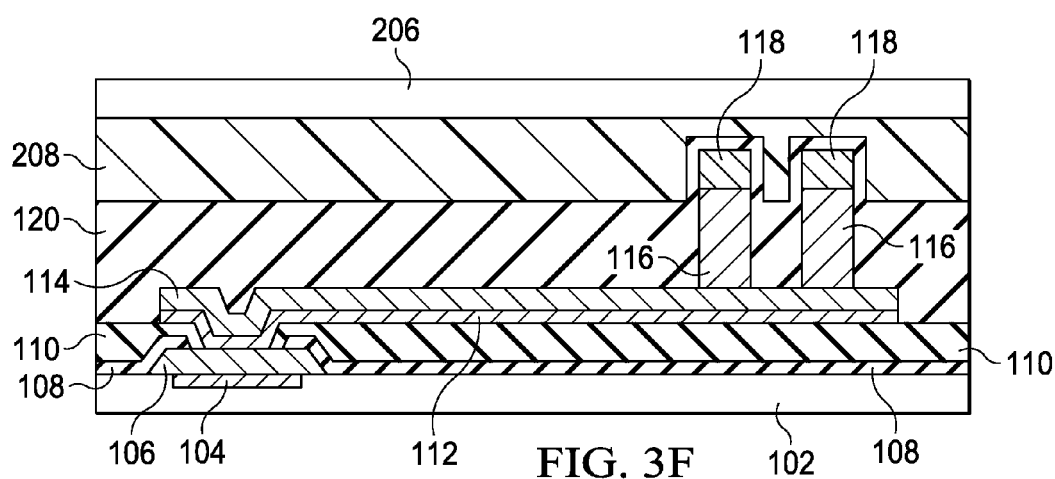

In FIG. 3F, a release film 208 mounted on a carrier 206 is pressed on the stress buffer layer 120. In some embodiments, the release film 208 comprises polymer material and has a thickness of about 100 μm. In some embodiments, the release film 208 is pressured with about 300 kN clamping force and the stress buffer layer 120 is cured with a thermal process for about 7 minutes at about 150° C. temperature.

Figure 3G:
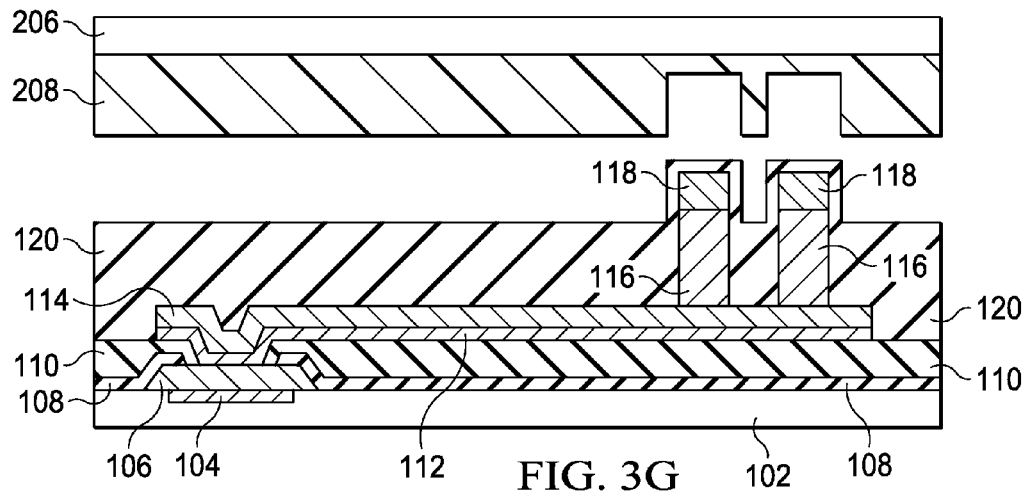

In FIG. 3G, the release film 208 is removed.

Figure 3H:
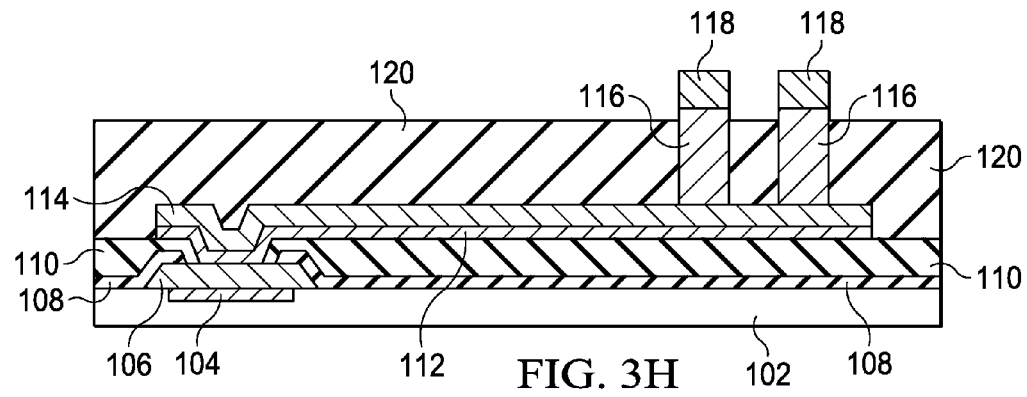

In FIG. 3H, the stress buffer layer 120 is plasma cleaned to expose the solder layer 118 and the top portion of the hollow metal pillar 116. In some embodiments, the plasma cleaning uses Ar/O₂ for 60 seconds.

Figure 3I:
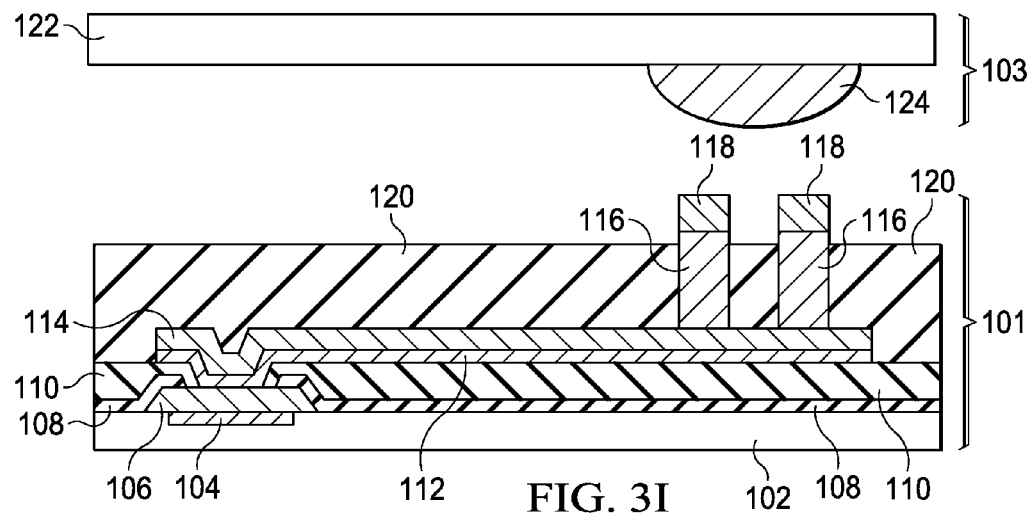

In FIG. 3I, the top package 103 including the top substrate 122 and the solder pad 124 is mounted to the bottom package 101 with the solder layer 118. Then the solder pad 124 and solder layer 118 are reflowed to electrically connect the top package 103 and the hollow metal pillar 116 of the bottom package 101 in some embodiments.

According to some embodiments, an integrated circuit includes a bottom substrate, a metal layer disposed over the bottom substrate and a hollow metal pillar disposed on the metal layer. The metal layer and the hollow metal pillar are electrically connected.

According to some embodiments, a method includes forming a metal layer over a bottom substrate. A hollow metal pillar is formed on the metal layer. The metal layer and the hollow metal pillar are electrically connected.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. An integrated circuit, comprising:
   a bottom substrate;
   a metal layer disposed over the bottom substrate; and
   a hollow metal pillar disposed on the metal layer, and a stress buffer layer inside the hollow metal pillar and surrounding the hollow metal pillar
   wherein the metal layer and the hollow metal pillar are electrically connected.

2. The integrated circuit of claim 1, further comprising a passivation layer between the bottom substrate and the metal layer.

3. The integrated circuit of claim 1, further comprising a solder layer disposed on the hollow metal pillar.

4. The integrated circuit of claim 3, further comprising a top package disposed over the solder layer.

5. The integrated circuit of claim 1, wherein the metal layer is a redistribution layer.

6. The integrated circuit of claim 1, wherein the hollow metal pillar comprises copper.

7. The integrated circuit of claim 1, further comprising a contact pad below the metal layer wherein the contact pad and the metal layer are electrically connected.

8. The integrated circuit of claim 1, wherein the hollow metal pillar has an inside divider.

9. The integrated circuit of claim 8, wherein the inside divider is aligned with a direction of coefficient of thermal expansion (CTE) mismatch.

10. An integrated circuit, comprising:
a bottom substrate;
a passivation layer disposed over the bottom substrate;
a metal layer disposed over the passivation layer;
a hollow metal pillar disposed on the metal layer;
a stress buffer layer inside the hollow metal pillar and surrounding the hollow metal pillar; and
a solder layer disposed on the hollow metal pillar, wherein the metal layer, the hollow metal pillar, and the solder layer are electrically connected.

11. The integrated circuit of claim 10, wherein the passivation layer comprises at least two passivation sub-layers.

12. The integrated circuit of claim 10, wherein the hollow metal pillar has a substantially circular cross-section, when viewed from a top down view, and has an inside divider extending from a first sidewall of the hollow metal pillar to a second sidewall of the hollow metal pillar.

13. The integrated circuit of claim 12, wherein the layers of the integrated circuit have a coefficient of thermal expansion (CTE) mismatch that extends along a first direction and wherein the inside divider has a major axis that extends along the first direction.

14. The integrated circuit of claim 13 wherein the first direction extends from a center of the integrated circuit to an edge of the integrated circuit.

15. An integrated circuit, comprising:
a first package including:
a bottom substrate,
a metallization layer on the bottom substrate,
a contact pad on and in electrical contact with the metallization layer,
a passivation layer on the contact pad, the passivation having an opening therein exposing the contact pad,
a redistribution line extending laterally along an upper major surface of the passivation layer,
a hollow metal pillar extending orthogonally to the upper major surface of the passivation layer and in electrical and physical contact with the redistribution line, and
a stress buffer layer surrounding the hollow metal pillar; and
a second package electrically and physically connected to the first package by a solder joint.

16. The integrated circuit of claim 15, wherein the stress buffer layer fills the hollow metal pillar.

17. The integrated circuit of claim 15, wherein the stress buffer layer comprises a molding compound.

18. The integrated circuit of claim 15, wherein the hollow metal pillar has a substantially circular cross-section, when viewed from a top down view, and has an inside divider extending from a first sidewall of the hollow metal pillar to a second sidewall of the hollow metal pillar.

19. The integrated circuit of claim 18, wherein the layers of the integrated circuit have a coefficient of thermal expansion (CTE) mismatch that extends along a first direction and wherein the inside divider has a major axis that extends along the first direction.

20. An integrated circuit, comprising:
a bottom substrate;
a metal layer disposed over the bottom substrate; and
a hollow metal pillar disposed on the metal layer, wherein the hollow metal pillar has an inside divider;
wherein the metal layer and the hollow metal pillar are electrically connected.

21. The integrated circuit of claim 20 wherein the inside divider is aligned with a direction of coefficient of thermal expansion (CTE) mismatch.

* * * * *